Dec. 30, 1969 J. M. SCHAEFER 3,487,323
BALANCED DIFFERENTIAL AMPLIFIER WITH DUAL COLLECTOR CURRENT REGULATING MEANS
Filed June 4, 1968
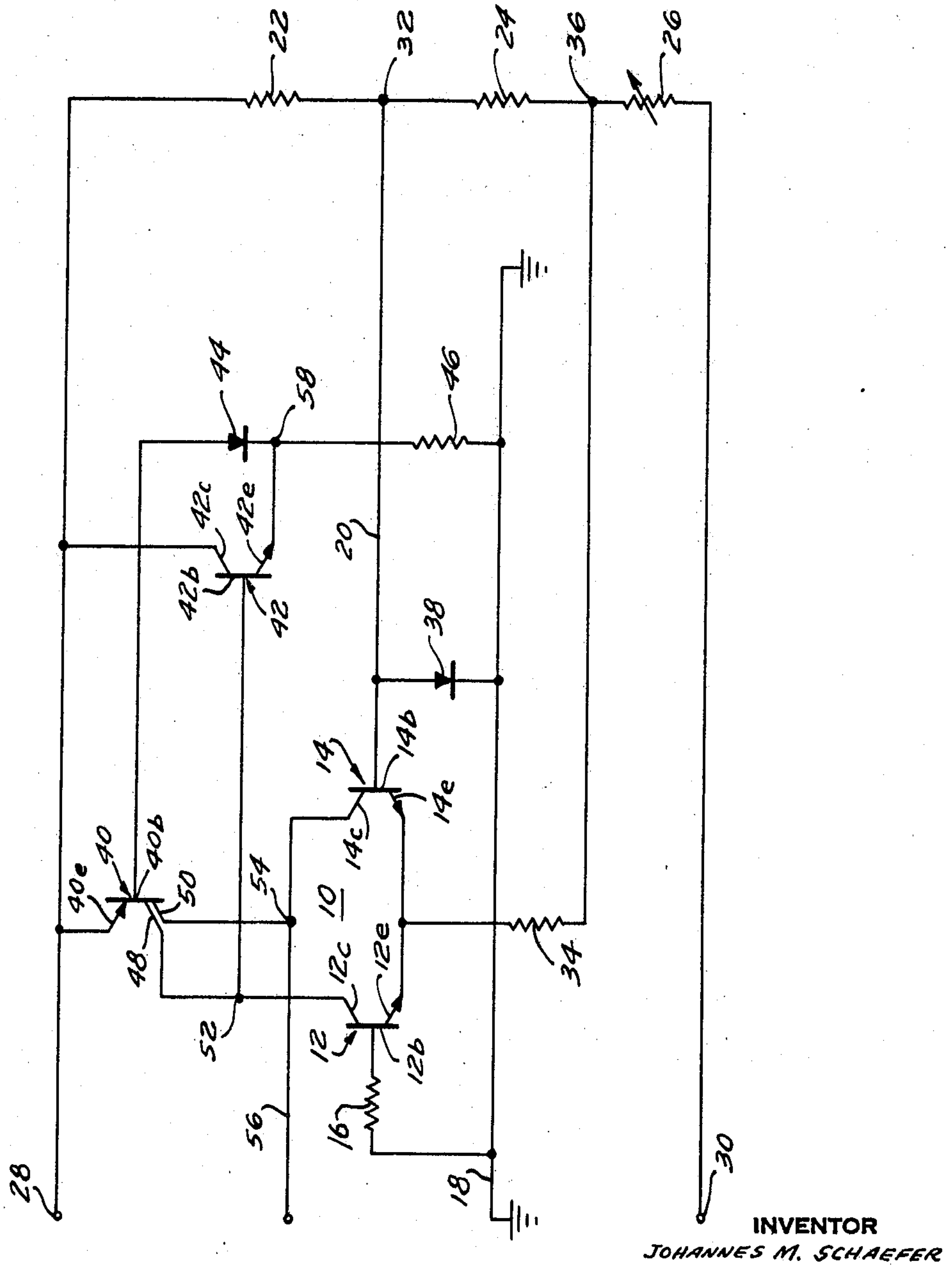
INVENTOR
JOHANNES M. SCHAEFER
BY James and Franklin
ATTORNEYS United States Patent Office 3,487,323

Patented Dec. 30, 1969

3,487,323
BALANCED DIFFERENTIAL AMPLIFIER WITH DUAL COLLECTOR CURRENT REGULATING MEANS

Johannes M. Schaefer, Im Schlossfeld, Germany, assignor to Technipower Incorporated, Ridgefield, Conn., a corporation of Connecticut Filed June 4, 1968, Ser. No. 734,295
Int. Cl. H03f 3/68
U.S. Cl. 330—30 28 Claims

ABSTRACT OF THE DISCLOSURE

A balanced differential amplifier circuit produces an output signal corresponding to the deviation of an input signal relative to a reference signal, these signals being respectively applied to the inputs of a pair of semiconductor elements in separate branches of the circuit. An additional semiconductor element is provided which supplies substantially equal currents to each of the respective circuit branches. The additional semiconductor element is controlled by means sensitive to the current in one branch, that means detecting an imbalance between the current supplied to that branch by the additional semiconductor element and the current flowing through the semiconductor element in that branch. Such an imbalance, when detected, is effective to modify the currents provided by the additional semiconductor element to both of the circuit branches, thereby producing said output signal. The amplifier circuit of this invention does not require load resistors, and hence may readily be incorporated into an integrated circuit chip. The additional semiconductor element along with its control circuitry maintains close balance in the differential amplifier over a wide range of magnitudes of current flowing through the circuit branches.

The present invention relates to a balanced differential amplifier circuit, and particularly to such a circuit having the capability of producing an output signal corresponding to deviations of an input signal applied to one branch thereof from a predetermined value.

In many circuit applications, it is desirable and often necessary to be able to obtain an indication corresponding to the deviation of the magnitude of an input signal with respect to a predetermined value. A reference signal having a magnitude corresponding to the nominal value of the input signal is applied to one of the inputs of a balanced differential amplifier, an input signal being applied to the other input thereof. The differential amplifier compares the input and reference signals, and produces an error signal corresponding to any deviation between the input and reference signals.

In one conventional design of a balanced differential amplifier, a constant current source is connected to the emitters of each transistor forming the branches of the differential amplifier, the reference signal and input signal being applied respectively to the bases of these transistors. Matching resistors are connected in the collector circuit of each transistor, a voltage drop developing thereacross in proportion to the collector current flowing in each transistor. If the input signal is at a desired level, that is, equal to the reference signal, the base voltages, and thus, the collector currents flowing in each branch of the balanced amplifier, will also be equal, thus producing an equal voltage drop in the collector resistors. The output signal may be defined by the difference between the voltages developed across the matching collector resistors; and since these drops are equal when the input signal is at nominal value, there will then be no error signal. However, when the input signal deviates from the reference signal, the collector currents will become unequal, resulting in unequal voltage drops in the collector resistors, thus producing an output signal which will correspond to the magnitude of the deviation of the input signal from the nominal or reference value.

In many instances the output signal is defined by the voltage developed across a given one of the collector resistors. Under these circumstances if the current of the "constant current" source varies, the voltage across the output resistor will vary even though there is no input signal to the circuit, and hence a false output signal will be generated. This presents a particular problem when the so-called "constant current" source is affected by a variable factor, such as the output voltage sensing circuit of a power supply. Under not uncommon conditions, such as transients arising from load changes or from programmed operation, the current in the output voltage sensing circuit of a power supply can be many times the normal value, and this will result in the current through the branches of the differential amplifier circuit being many times their normal value. This not only tends to produce a false output signal when that signal is derived from a single collector resistor, as explained above, but also tends to cause that false signal to remain even after the conditions which have brought it about no longer exist. This comes about because the individual resistor-containing branches of the circuit saturate, limiting the output of the amplifier circuit; the circuit to which that output is fed may interpret the limited output as a command to try to increase the output even further, thereby making a permanent condition out of a transient one. Hence, particularly for large error signals, control of the output signal may be effectively lost until the unsaturated status of the transistor is re-established, thus rendering the circuit at least temporarily ineffective.

In recent years, one of the more significant developments in the design and packaging of electronic circuitry has been the development of integrated circuits, wherein a plurality of electrical elements such as transistors, capacitors and resistors are all packaged or formed on a single chip of semi-conductor material. The formation of elements such as resistors on these chips requires relatively sophisticated technology and necessitates precise control over the operations performed on the semi-conductor material. The production of balanced amplifier circuits in integrated form has presented great problems because, as noted above, the conventional differential balanced amplifiers require the use of separate, substantially identical, resistances connected in the collector circuits of each of the transistors forming the balanced amplifier circuit. The temperature coefficient of the resistance material on the circuit chip, under certain conditions, contributes to the overall temperature coefficient of the amplifier, thus presenting problems of temperature stability. It will thus be understood that the elimination of these matching resistors from a balanced amplifier circuit of this type would greatly facilitate the formation of this circuit on an integrated circuit wafer.

Moveover, the circuitry here involved, whether incorporated into an integrated circuit chip or embodied in more conventional discrete elements, effectively avoids the loss of control sometimes resulting from saturation, as described above. In the circuit of the present invention the two branches of the differential amplifier remain effective to sense input variations and produce corresponding output variations independent of the total current flowing therethrough. The circuitry is also far less sensitive to temperature variations than prior art circuits, and it has a greater gain than prior art circuits. Both of these latter advantages derive from the absence of resistors in the two branches of the circuit. Resistors constitute a source of temperature error, and their absence eliminates that source of error. Resistors in the collector circuits in parallel with the output impedance reduce the gain of the amplifier, and the absence of such resistors therefore increases the gain.

It is a general object of the present invention to provide a differential balanced amplifier which can be readily incorporated into an integrated circuit chip and which requires a lesser number of resistors than has formerly been used.

It is a further object of the present invention to provide a balanced differential amplifier requiring no resistors in the collector circuits of the amplifier.

It is a still further object of the present invention to provide a balanced differential amplifier circuit which provides an accurate amplified indication of the deviation of an input signal from the desired value thereof.

It is another object of the present invention to provide a balanced amplifier circuit for providing an output signal corresponding to a deviation in an input signal from a nominal value in which saturation of the amplifier is effectively prevented, even for relatively large deviations in the input signal or in the current commonly supplied to the emitters of the transistors of the differential amplifier, so that control of the output signal is continuously maintained.

To these ends, the present invention provides a balanced amplifier circuit comprising a pair of semi-conductor elements, such as transistors, having control electrodes biased respectively by the input signal and the reference signal. Means connected in circuit relation with said semi-conductor elements are provided to supply substantially equal current flow to each of these elements, for both balanced and unbalanced input conditions. When the current of one input transistor (i.e. the one that does not provide the output signal) is not in balance with the current supplied by the current supply means, as a result of a deviation in the input signal, this deviation is sensed by a control means in circuit relation with the amplifier elements and with the current supplying means, which thereupon controls the current supply means for more or less current depending on the nature of the deviation so as to tend to re-establish balance, thereby to develop an output signal which corresponds to the deviation in the input signal.

The equal current supply means is preferably a dual output lateral transistor having a single base and emitter controlling the current flow in two collectors, the collectors being so formed as to have a substantially equal current flow in each of them, the magnitude of this current being substantially independent of the loads applied to the collectors. A control transistor is connected in substantial parallel bypass relation with the base-emitter circuit of the dual output transistor and has its bias controlled by a signal corresponding to the deviation between the current flowing in each of the two collectors and the current carried by one of the two transistors of the differential pair, i.e. the one that does not provide the output signal, so that when there is a deviation, the bias condition of the control transistor is varied so as to vary the current flow through the dual output transistor, thereby to tend to re-establish the balance between the dual-output-transistor current and that carried by the appropriate one of the differential pair transistors, thus developing the output signal in the circuit including the other one of the differential pair transistors. A common resistor is provided in the emitter circuits of each of the transistors in the balanced differential amplifier, and the current through this resistor is the sum of the emitter currents through each of those transistors. Since the dual output transistor current source provides whatever current is commonly carried by the differential amplifier without disturbing the balance of the differential amplifier, there is no need for a constant current source in the emitter circuit. The output signal produced by the circuit of this invention is defined by the current differential between the current supplied by the dual output transistor and the current flow in the transistor of the differential amplifier to which the input signal is applied, the latter current being responsive to the magnitude of the input signal.

Here, an output signal is produced which is an amplified version of the deviation of the input signal from nominal value, but without having to provide two accurately matched resistors, one in each branch of the circuit. Instead, changes in the conductivity of the output circuit of the transistor to which the input signal is applied produce such an output signal.

To the accomplishment of the above, and to such other objects as may hereinafter appear, the present invention relates to the design of a differential balanced amplifier circuit, as defined in the appended claims, and as described in this specification, taken together with the single accompanying figure, which is a circuit diagram of an exemplary embodiment of the invention.

The circuit illustrated in the single figure comprises a balanced amplifier, generally designated as 10, which includes a pair of similar transistors 12 and 14 arranged in parallel, transistor 12 comprising base, collector and emitter terminals 12*b*, 12*c* and 12*e* respectively, transister 14 similarly comprising base, collector and emitter terminals designated respectively as 14*b*, 14*c* and 14*e*. A reference signal which, for the sake of convenience, is set at ground or reference potential, is applied to base 12*b* of transistor 12 through a suitable base resistor 16 connected between base 12*b* and the ground line 18. An input signal, here shown for purposes of illustration as representative of the magnitude of a power supply output voltage, is applied to the base 14*b* of transistor 14 through line 20. The power supply output voltage, which is produced at an external circuit (not shown) is applied to terminals 18 and 30 and a reference voltage is applied to terminals 18 and 28. A voltage divider comprising resistors 22 and 24 and a variable resistor 26, is connected across terminals 28 and 30. The input signal for the circuit of the present invention is derived at point 32 between resistors 22 and 24, and resistor 26 is varied until at the desired level of the output voltage signal, the resultant potential at point 32 is at reference or ground potential.

A common emitter resistor 34 is connected between the emitters 12*e* and 14*e* and point 36 between resistors 24 and 26, so that a suitable and equal biasing potential is applied to the emitters 12*e* and 14*e* of transistors 12 and 14. Diode 38 is connected between the base 14*b* of transistor 14 and ground to limit the excursion of the potential at base 14*b* towards positive values. Without the inclusion of diode 8, a strong positive input to transistor 14, could, through the collector-to-base junction of transistor 14, raise the output potential at output signal lead 56 instead of lowering it.

When the output signal developed at the external circuit is at its desired level, the input signal to the base 14*b* of transistor 14 will be established at ground which corresponds to the reference input at the base 12*b* of transistor 12. Under these circumstances, balanced circuit operation is effected. However, when the input signal deviates from its desired value due, for example, to a variation in the load fed by the power supply, amplifier 10 is unbalanced, causing an imbalance in the current flows in the collector-emitter paths of transistors 12 and 14. It is desired to obtain an indication of this deviation in the form of an output signal, which can then be used to vary the power supply to return its output voltage to its desired level.

To this end, current means in the form of a dual collector or lateral transistor 40 is provided for supplying substantially equal current flow to the collector circuits of transistors 12 and 14. In addition, means in the form of a control transistor 42, connected in substantial effective parallel bypass circuit relation with the emitter-base circuit of dual collector transistor 40, is provided to sense the difference between the current of one collector of dual output transistor 40, and the collector current of one of the differential amplifier transistors, and thereby to control the operation of the dual collector transistor 40 to vary the current supplied thereby to transistors 12 and 14. This develops an output signal corresponding to the deviation of the input signal from ground as reflected at the base **14*b* of transistor 14**.

Thus, dual collector or lateral transistor 40 comprises an emitter **40*e* connected to terminal 28, a base 40*b* connected through a diode 44 and a suitable base resistor 46 to ground, and a pair of collectors 48 and 50. The dual collector transistor 40 is designed to have the characteristic that the ratio of current flow in the respective collectors is dependent upon the respective areas of the collector junctions. In the preferred embodiment of this invention here specifically illustrated, it is desired that the current in the collectors 48 and 50 of transistor 40 be substantially equal so that the areas of the respective collectors 48 and 50 in transistor 40 are accordingly also substantially equal. The base 42*b* of control transistor 42 is directly connected to point 52, located between the collector 12*c* of transistor 12 and collector 48 of the dual collector transistor 40. The other collector 50 of transistor 40 is connected to the collector 14*c* of transistor 14. Output signal lead 56 is connected to point 54 between collectors 50 and 14*c*, and is connected to an output control circuit (not shown), which may control the operation of the external power supply in any conventional manner. The collector 42*c* of the control transistor 42 is connected to the terminal 28, while its emitter 42*e* is connected to point 58, which is located between diode 44 and resistor 46**.

The manner of operation of the circuit is as follows: During balanced operation of the amplifier 10, that is, when the input signal applied to base **14*b* is at ground potential, substantially equal currents will flow in the output (collector-emitter) circuits of both transistors 12 and 14. Since the collector circuit of transistor 14 is connected through lead 56 to a high input impedance external output signal control circuit, the current from collector 50 of dual collector transistor 40 will be slightly divided. That is, even at balanced operation of amplifier 10, a slight current will flow through lead 56, causing the current flow in the collector-emitter circuit of transistor 14 to be slightly below that of the corresponding current in transistor 12. The sum of the collector-emitter currents of transistors 12 and 14 flows through common emitter resistor 34**.

Assuming now that power supply output voltage increases above its desired level so that a negative input signal is applied to the base **14*b* of transistor 14, the emitter-base bias potential of transistor 14 will increase the effective internal resistance of the output (collector-emitter) circuit of transistor 14, causing an increase in the current flow in lead 56 and a corresponding decrease in the collector-emitter current in transistor 14, the current supplied by collector 50 remaining unchanged at this time. The increase in the current flow in lead 56 represents an increase in the output of the amplifier as a result of the change in the input thereto (and, as we shall see, this is not the only output increase which will result therefrom). Since the potential at point 36 remains substantially constant, the current passing through resistor 34, that is to say, the sum of the collector-emitter currents through transistors 12 and 14, will also remain substantially constant. Since the collector-emitter current in transistor 14 has decreased, the collector-emitter current through transistor 12** must increase.

However, the current characteristic of the dual collector transistor 40, having its collectors respectively connected directly to the respective collectors of transistors 12 and 14, tends to supply an equal current flow to the collector circuits of each of these transistors, that is to say, the currents through collectors 48 and 50 are equal. The current from collector 48 goes mainly to the collector of transistor 12, but some portion of it also goes to the base **42*b* of transistor 42. When, as we have seen, the collector-emitter circuit of transistor 12 requires increased current to match the decreased current passing through the collector-emitter circuit of transistor 14, less current flows to the base of transistor 42, thereby decreasing its effective collector-emitter current flow. Since control transistor 42 is in effective parallel, bypassing relation with the emitter-base circuit of dual collector transistor 40, a decrease in the collector-emitter current of transistor 42 will result in less current being bypassed through transistor 42. Hence, the base current for transistor 40 will be increased, and with it the output current through collectors 48 and 50. The increase in the current in collector 48 comes about as a result of the increase in the collector-emitter current in transistor 12, which in turn comes about because of the decrease in the collector-emitter current in transistor 14. The increase in the current at collector 48 has its counterpart in an increase in the current at collector 50. Part of this increase current at collector 50 flows through the collector-emitter circuit of transistor 14, and another part of it flows out through lead 56. This latter part in lead 56 constitutes an additional increase in output, the overall output signal thus being an amplified version of the deviation of the input signal from its desired level. This output signal, in the power supply example here discussed, will return the power supply output voltage to its desired level, thereby to return the input signal at the base 14*b* of transistor 14 to ground potential and the condition of the circuit as a whole to its original condition. The current output signal in lead 56 will remain at the increased level so long as the level of the input signal at the base of transistor 14** is different from the reference signal.

It will be understood that when the output signal decreases below its desired level, causing a positive input signal to appear at base **14*b* of transistor 14 and a decrease in the effective internal resistance of transistor 14, the operation of the circuit of this invention will be similar to that described above, but with the relative increases and decreases of signals and currents being reversed. The output signal produced as a result of a positive deviation of the input signal will be indicated by a decrease in the current in error signal lead 56 from the value of the current in lead 56** for balanced operation.

It will be noted that as a result of the operation of the dual collector transistor 40 providing increased current for transistor 14 when the voltage at base **14*b* is below nominal value as a result of a decrease in the input signal, and providing decreased current when the input signal is above nominal value, transistor 14** is effectively prevented from becoming either saturated or cutoff, even for relatively large swings in the input signal. As a result, continuous and quickly responsive monitoring and control of the input signal is provided, even for large deviations thereof.

Thus, it will be appreciated that an effective differential amplifier circuit has been provided to derive an output signal corresponding to a deviation of an input signal from its predetermined value, which circuit does not require the use of matched load resistors in the respective collector circuits of the balanced amplifier transistors, nor a constant current source in the emitter circuit of the differential amplifier. As the load resistors are not required in the circuit of this invention, the formation of the circuit of this invention on an integrated circuit chip is greatly facilitated, thus providing greater utilization of this circuit in miniaturized circuits having reduced space and power requirements.

While only a single embodiment of the present invention has been specifically disclosed, it will be appreciated that many variations may be made thereto without departing from the scope of the present invention as defined in the appended claims.

I claim:

1. A circuit for comparing an input signal with a reference signal to produce an output signal when said input signal deviates from said reference signal, said circuit comprising:

first semiconductor means, having said reference signal applied thereto;

second semiconductor means in parallel circuit arrangement with said first semiconductor means forming therewith a balanced amplifier, said second semiconductor means having said input signal applied thereto;

means in circuit relation with said first and second semiconductor means for supplying and maintaining substantially equal current flow thereto;

control means in circuit relation with one of said semiconductor means and with said current supplying means for sensing the comparative magnitude of said input signal and for controlling the current output of said current supplying means in response to the comparative magnitude of said input signal so as to vary the magnitude of the current in one of said semiconductor means, and output signal means in circuit relation with said second semiconductor means.

2. The circuit of claim 1, in which said first and second semiconductor means are first and second transistors respectively, each of said transistors having base and output terminals.

3. The circuit of claim 2, further comprising a resistor commonly connected to corresponding output terminals of each of said first and second transistors, the input and reference signals being applied to the respective base terminals of said transistors, thereby to affect the current flow through said resistor.

4. The circuit of claim 1, said current supplying means comprising a dual output transistor, the currents developed in each output thereof being substantially equal.

5. The circuit of claim 4, in which said first and second semiconductor means are first and second transistors respectively, each of said transistors having base and output terminals.

6. The circuit of claim 5, in which said control means comprises means for varying the output currents in said current supplying means in response to the relative value of said input signal.

7. The circuit of claim 6, in which said balanced amplifier circuit is completely formed on a unitary integrated circuit chip.

8. The circuit of claim 5, further comprising a resistor commonly connected to corresponding output terminals of each of said first and second transistors, the input and reference signals being applied to the respective base terminals of said transistors, thereby to affect the current flow through said resistor.

9. The circuit of claim 5, in which said control means comprises a bypass transistor, the biasing thereof being effectively determined by the magnitude of said input signal.

10. The circuit of claim 9, in which said bypass transistor is in effective parallel bypass circuit relationship with the base emitter circuit of said dual output transistor.

11. The circuit of claim 9, further comprising a resistor commonly connected to corresponding output terminals of each of said first and second transistors, the input and reference signals being applied to the respective base terminals of said transistors, thereby to affect the current flow through said resistor.

12. The circuit of claim 11, in which the base of said bypass transistor is connected to the collector of one of said first and second transistors, thereby to establish the bias condition therefor.

13. The circuit of claim 1, in which said balanced amplifier circuit is completely formed on a single integrated circuit chip.

14. The circuit of claim 1, in which said current supplying means comprises a dual output transistor, said first and second semiconductor means comprising first and second transistors, and said control means comprises a bypass transistor, the base thereof being connected to a line between said dual output transistor and said first transistor, said output signal being taken from a line between said dual output transistor and said second transistor.

15. The circuit of claim 14, further comprising a resistor commonly connected to corresponding output terminals of each of said first and second transistors, the input and reference signals being applied to the respective base terminals of said transistors, thereby to affect the current flow through said resistor.

16. The circuit of claim 14, in which said first and second transistors and said dual output transistor and said bypass transistor are all completely formed on a single integrated circuit chip.

17. The circuit of claim 1, in which said first and second semiconductor means have output circuits respectively, said input signal being effective to vary the output circuit resistance of said second semiconductor means, thereby initially to vary the current flowing therethrough, said control means being connected to a point on the output circuit of said first semiconductor means and to said current supplying means and effective to vary the current supplied thereby in accordance with the electrical condition of said point.

18. The circuit of claim 17, in which said first and second semiconductor means are first and second transistors respectively, each of said transistors having base and output terminals.

19. The circuit of claim 18, further comprising a resistor commonly connected to corresponding output terminals of each of said first and second transistors, the input and reference signals being applied to the respective base terminals of said transistors, thereby to affect the current flow through said resistor.

20. The circuit of claim 19, said current supplying means comprising a dual output transistor, the currents developed in each output thereof being substantially equal.

21. The circuit of claim 20, in which said first and second semiconductor means are first and second transistors respectively, each of said transistors having base and output terminals.

22. The circuit of claim 21, in which said first and second transistors and said dual output transistor and said bypass transistor are all completely formed on a single integrated circuit chip.

23. The circuit of claim 18, said current supplying means comprising a dual output transistor, the currents developed in each output thereof being substantially equal.

24. The circuit of claim 23, in which said control means comprises a bypass transistor, the biasing thereof being effectively determined by the magnitude of said input signal.

25. The circuit of claim 24, in which said first and second transistors and said dual output transistor and said bypass transistor are all completely formed on a single integrated circuit chip.

26. The circuit of claim 17, in which said control means comprises a bypass transistor, the biasing thereof being effectively determined by the magnitude of said input signal.

27. The circuit of claim 26, in which said balanced amplifier circuit is completely formed on a single integrated circuit chip.

28. The circuit of claim 17, in which said balanced amplifier circuit is completely formed on a single integrated circuit chip.

References Cited

UNITED STATES PATENTS

| | | | |
|---|---|---|---|
| 3,250,981 | 5/1966 | Marks | 307—235 X |
| 3,341,785 | 9/1967 | Merryman et al. | 330—38 X |

ROY LAKE, Primary Examiner

LAWRENCE J. DAHL, Assistant Examiner

U.S. Cl. X.R.

307—235